United States Patent
Kim et al.

(10) Patent No.: US 12,009,043 B2
(45) Date of Patent: Jun. 11, 2024

(54) INTEGRATED CIRCUIT CHIP AND DIE TEST WITHOUT CELL ARRAY

(71) Applicant: SK hynix Inc., Icheon-si (KR)

(72) Inventors: Ji-Hwan Kim, Seoul (KR); Sang-Muk Oh, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 663 days.

(21) Appl. No.: 16/667,738

(22) Filed: Oct. 29, 2019

(65) Prior Publication Data
US 2020/0219582 A1  Jul. 9, 2020

(30) Foreign Application Priority Data

Jan. 3, 2019 (KR) .................. 10-2019-0000682

(51) Int. Cl.
| | |
|---|---|
| G11C 29/44 | (2006.01) |
| G11C 5/02 | (2006.01) |
| G11C 5/06 | (2006.01) |
| H01L 23/538 | (2006.01) |
| H01L 25/065 | (2023.01) |

(52) U.S. Cl.
CPC ............ *G11C 29/4401* (2013.01); *G11C 5/02* (2013.01); *G11C 5/06* (2013.01); *H01L 23/5384* (2013.01); *H01L 23/5385* (2013.01); *H01L 25/0657* (2013.01)

(58) Field of Classification Search
CPC ......... G11C 29/4401; G11C 5/02; G11C 5/06; H01L 23/5384; H01L 23/5385; H01L 25/0657

See application file for complete search history.

(56) References Cited

U.S. PATENT DOCUMENTS

| | | | | |
|---|---|---|---|---|
| 8,339,879 B2 * | 12/2012 | Choi | ....................... | H01L 22/22 |
| | | | | 365/198 |
| 8,384,417 B2 * | 2/2013 | Laisne | .................... | H01L 22/22 |
| | | | | 326/16 |
| 8,717,839 B2 * | 5/2014 | Yokou | .................. | G11C 29/022 |
| | | | | 365/201 |
| 8,917,569 B2 * | 12/2014 | Choi | .................... | G11C 29/802 |
| | | | | 365/225.7 |
| 10,468,386 B1 * | 11/2019 | Sato | ........................ | G11C 5/025 |
| 2010/0060310 A1 | 3/2010 | Laisne et al. | | |
| 2010/0295600 A1 | 11/2010 | Kim et al. | | |
| 2011/0006391 A1 | 1/2011 | Lee et al. | | |

(Continued)

FOREIGN PATENT DOCUMENTS

| | | |
|---|---|---|
| CN | 101494088 A | 7/2009 |
| CN | 102467964 A | 5/2012 |

(Continued)

*Primary Examiner* — Vanthu T Nguyen
(74) *Attorney, Agent, or Firm* — WILLIAM PARK & ASSOCIATES LTD.

(57) ABSTRACT

An integrated circuit chip includes a first through electrode and a second through electrode formed through the integrated circuit chip, a transmission circuit suitable for selecting one of signals transmitted through the first and second through electrodes, respectively, and transmitting the selected signal to a data line, in response to a selection signal, and a selection signal generation circuit suitable for generating the selection signal by toggling the selection signal, during a test operation.

20 Claims, 4 Drawing Sheets

(56) References Cited

U.S. PATENT DOCUMENTS

| | | | | |
|---|---|---|---|---|
| 2012/0104388 A1* | 5/2012 | Choi | ............... | G11C 29/806 |
| | | | | 438/4 |
| 2016/0141014 A1* | 5/2016 | Lee | ............... | G11C 7/1039 |
| | | | | 365/189.05 |
| 2018/0107387 A1* | 4/2018 | Chae | ............... | G11C 29/028 |

FOREIGN PATENT DOCUMENTS

| | | | |
|---|---|---|---|
| CN | 102520340 | A | 6/2012 |
| CN | 102539852 | A | 7/2012 |
| CN | 102592647 | A | 7/2012 |
| CN | 102655101 | A | 9/2012 |
| CN | 102738119 | A | 10/2012 |
| CN | 109037192 | A | 12/2018 |
| CN | 109037193 | A | 12/2018 |
| KR | 1020140030608 | A | 3/2014 |
| KR | 1020150085977 | A | 7/2015 |
| KR | 1020210070391 | A | 6/2021 |

\* cited by examiner

INTEGRATED CIRCUIT CHIP AND DIE TEST WITHOUT CELL ARRAY

CROSS-REFERENCE TO RELATED APPLICATION

This application claims priority under 35 U.S.C. § 119 to Korean Patent Application No. 10-2019-0000682 filed on Jan. 3, 2019, which is incorporated herein by reference in its entirety.

BACKGROUND

1. Field

Exemplary embodiments relate generally to an integrated circuit chip and a memory device, and more particularly to a wafer level testing of an integrated circuit chip having no memory storage.

2. Discussion of the Related Art

A semiconductor package typically refers to a casing made of plastic, ceramic, metal, glass, etc. to contain one or more integrated circuit chips or semiconductor devices. There are benefits to packaging semiconductor devices. Packaging provides a nice platform for external interconnection with a printed circuit board through leads, lands, balls, pins, wires, etc. The packaging also provides a nice shield from external environmental hazards such as mechanical damage, chemical corrosion, and light hazards. In addition, the packaging may provide a way for dissipating heat generated by the packaged semiconductor devices.

Thousands of individual integrated circuits are fabricated at a semiconductor wafer level. The integrated circuits are then cut from the semiconductor wafer into individual dies. The individual integrated circuits are tested for functional integrity before being packaged. The testing of the dies may be performed at the wafer level.

Higher performance and better miniaturization are the on-going pursuit of the semiconductor packaging industry. Three dimensional (3D) packaging refers to packaging a number of semiconductor chips stacked on top of each other and interconnected with each other through silicon vias (TSV) or through electrodes. A stacked memory device having a three dimensional (3D) structure may be implemented by vertically stacking two or more integrated circuit chips. The vertically stacked integrated circuit chips may be mounted on a substrate for a semiconductor package while electrically coupled to one another through through-silicon vias (TSVs) or through electrodes.

The three dimensional (3D) packaging provides higher performance and better miniaturization than two dimensional (2D) packaging. A two-dimensional (2D) structure arranges semiconductor chips on the horizontal surface of a printed circuit board (PCB) using wires or bumps. Vertically stacked semiconductor chips require less footprint than horizontally spread out semiconductor chips on a printed circuit board (PCB). Use of through electrodes, higher communication bandwidth and shorter data paths are provided in the three dimensional (3D) packaging than in a two-dimensional packaging. The stacked semiconductor memory devices can operate at a much higher speed since the signal transfer is performed through vertical input/output lines formed by the through electrodes and a wide memory bus.

Testing of the individual semiconductor devices prior to packaging as opposed to performing tests after packaging would be less wasteful, because, after packaging, discovering defective chip(s) would be too late to avoid discarding the entire package.

SUMMARY

In an embodiment, an integrated circuit chip may include: a first through electrode and a second through electrode formed through the integrated circuit chip; a transmission circuit suitable for selecting one of signals transmitted through the first and second through electrodes, respectively, and transmitting the selected signal to a data line, in response to a selection signal; and a selection signal generation circuit suitable for generating the selection signal by toggling the selection signal, during a test operation.

In an embodiment, an integrated circuit chip comprising a first data node and a second data node; a first latch circuit and a second latch circuit suitable for storing data inputted through the first and second data nodes, respectively; and a transmission circuit suitable for alternately transmitting the data stored in the first and second latch circuits to the first data node in response to a selection signal, during a test operation.

In an embodiment, a memory device comprising a first integrated circuit chip; and a plurality of second integrated circuit chips stacked over the first integrated circuit chip, wherein the first and second integrated circuit chips transmit/receive data through a plurality of through electrodes formed through the first and second integrated circuit chips, wherein the first integrated circuit chip comprises: a transmission circuit suitable for selecting one of data transmitted through a first through electrode and a second through electrode among the plurality of through electrodes and transmitting the selected data to a data line, in response to a selection signal; and a selection signal generation circuit suitable for generating the selection signal by toggling the selection signal, during a test operation.

In an embodiment, a method of performing a wafer level test on an integrated circuit chip having no cell array by utilizing a repair circuit configured to repair defective through electrodes to generate a test signal during the wafer level test, the method including: generating a toggling signal based on a read data strobe signal; providing two through electrodes coupled with two latch circuits configured to store test data from the coupled through electrodes; providing the toggling signal to a through electrode repair circuit as a selection signal, wherein the repair circuit is configured to select one of the two through electrodes in response to the logic level of the toggling signal; and during the wafer level test, generating the test signal by outputting the logic levels of the two latch circuits in response to the toggling signal.

DETAILED DESCRIPTION

Figure 1:
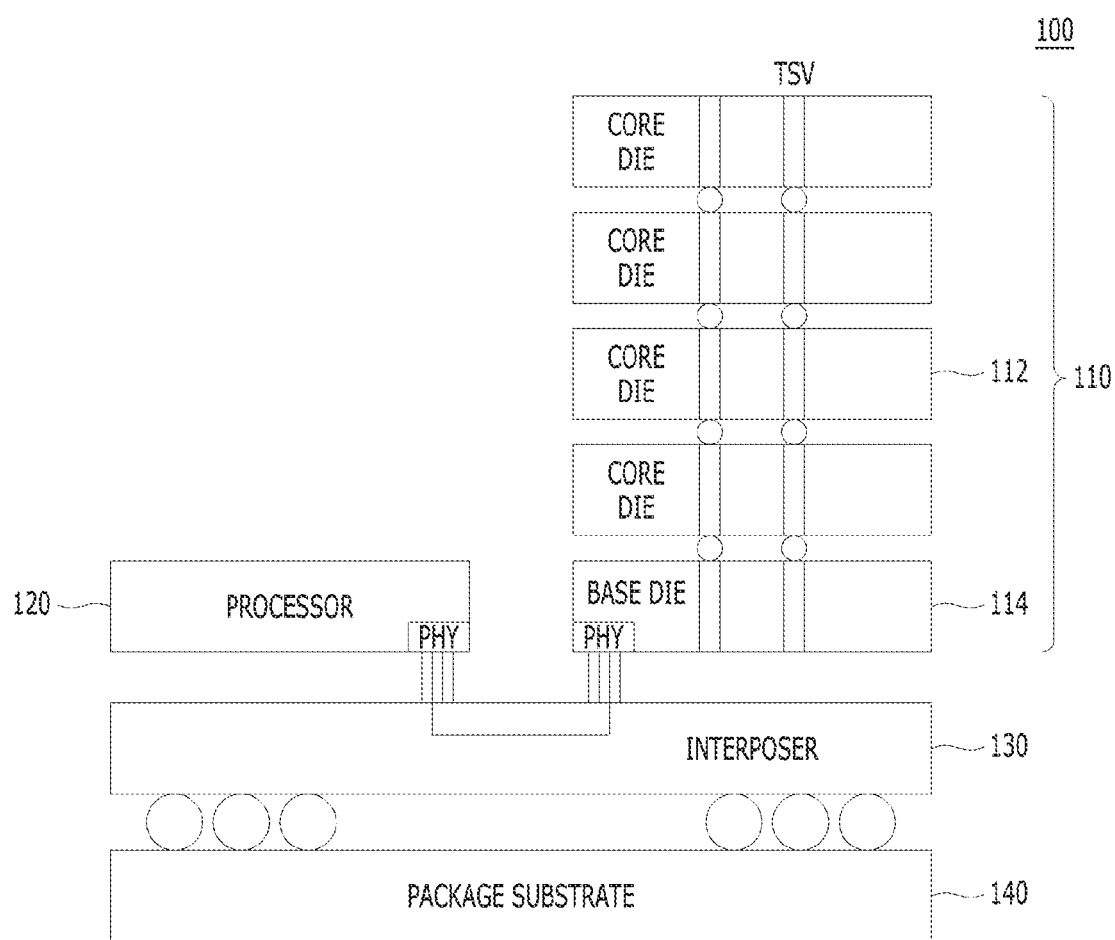
FIG. 1 shows a memory system having a memory device packaged therein in accordance with an embodiment of the present invention.

Various embodiments will be described below in more detail with reference to the accompanying drawings. The present invention may, however, be embodied in different forms and should not be construed as limited to the embodiments of the present disclosure set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Various embodiments may be directed to an integrated circuit chip capable of generating toggling data by switching a data path, and testing the data path using the toggling data.

Referring to FIG. 1, a memory system 100 according to an embodiment of the present disclosure may include, inter alia, a memory device 110 and a processor 120 formed over an interposer 130 and a package substrate 140.

The interposer 130 is formed over the package substrate 140, and the memory device 110 and the processor 120 are formed over the interposer 130 as shown in FIG. 1. An interposer 130 may be an electrical interface routing between one connection to another. By using an interposer 130, a connection can be rerouted to a different connection and/or a connection can be spread to a wider pitch. The role of the interposer 130 is to provide a path between the processor 120 and the memory device 110, and as such the electrical interconnect path provided by the interposer 130 provides closer integration between the memory device 110 and the processor 120. As such, the interposer 130 may provide an effective way for high speed communication between the processor 120 and the memory device 110. The interposer 130, which may be a silicon chip but passive without transistors, can provide much denser configuration having more connections and traces in a given area than an off-chip package.

In FIG. 1, the processor 120 may perform the memory control functions. The processor 120 may be a memory controller, or a memory controller may be integrated into the processor 120 as a part thereof. Thus, the processor 120 includes, inter alia, a digital circuit that manages data flow in and out of the memory device 110. The processor 120 may include various processors such as a central processing unit (CPU), a graphic processing unit (GPU), and an application processor (AP). Each of the memory controller 120 and the memory device 110 has an interface PHY, and the respective interfaces PHY of the controller 120 and the memory device 110 are coupled to each other through the interposer 130.

The memory device 110 includes a plurality of integrated circuit chips 112 and 114. The memory device 110 as shown in FIG. 1 is a three dimensional (3D) semiconductor device with a plurality of dies 112 and 114 stacked on top of each other. This three dimensional (3D) stacking reduces footprint and results in a smaller overall size of the package and may be suitable for high bandwidth memory operations while requiring less power. The three dimensional integrated memory device 110 includes a base die 114 (or also referred to as a first integrated circuit chip 114) with logic circuits for communicating with the processor 120 and a plurality of core dies 112 (or also referred to as second integrated circuit chips 112) stacked on the base die 114.

The base die 114 is interconnected with the core dies 112 through through silicon vias (TSV) or through electrodes and microbumps as shown in FIG. 1. The vertically stacked dies 112 and 114 of the memory device 110 are interconnected by through silicon vias (TSV) or through electrodes and communicate with the processor 120 through the interposer 130. Since the memory device 110 are disposed so close to the processor 120 and interconnected via the interposer 130, the shorter data paths between them are present. The shorter data paths combined with wide memory bus of the memory device 110 means that the processor 120 can communicate with the memory device 110 with lower latency at high speed.

For example, the memory device 100 may be a high bandwidth memory (HBM), although the scope of the present disclosure for the memory device 110 is not limited only to the high bandwidth memory (HBM). As a high bandwidth memory (HBM), the memory device 110 may, for example, be a high-performance RAM interface 114 for a 3D-stacked DRAM dies 112 that can be used in conjunction the processor 120, which may be a high performance processor such as GPU, CPU, AP, etc. as discussed above.

The base die (i.e., the first integrated circuit chip) 114, which is electrically coupled with the vertically stacked core dies 112 through the through silicon vias (TSV) or through electrodes may transmit/receive data to/from the processor 120 through the interface PHY.

Each of the core dies 112 may include a cell array for storing data therein and the circuits for writing and reading data to and from the cell array. On the other hand, the base die 114 may include logical circuits for interfacing with the core dies 112 and the processor 120. Configured in such a manner, the number of input/output units of the memory device 110 is significantly increased, thereby effectively increasing the bandwidth. As already discussed above, an example of the memory device 110 configured in such a manner may include a high bandwidth memory (HBM).

The base die 114 and the core dies 112 may be fabricated separately and then coupled to each other. The base die 114 and the core dies 112 may be separately tested before they are coupled. That is, the base die 114 may input/output data before the base die 114 is coupled to the core dies 112, in order to test whether the base die 114 has a defect. The testing may be configured to test for a bad die at every level. That is, it is possible to test the dies 112 and 114 individually before they are mounted into a stack or they may also be tested after they are stacked. However, testing the dies 112 and 114 individually before they are mounted would provide advantage in that only the defective die, instead of the entire stack of dies, can be discarded prior to packaging.

There may be over thousands of through silicon vias (TSV) and the respective pads formed in each die 112 or 114. The topmost die of the vertically stacked core dies 112 may not require through silicon vias (TSV) or through electrodes; nevertheless, the topmost die of the core dies 112 may still optionally be provided with through silicon vias (TSV) or through electrodes for manufacturing convenience or for other reasons. Through silicon vias (TSV) or through electrodes perform functions as efficient pathways for data transfers, I/O, power, etc. but the through silicon vias (TSV) or through electrodes are designed with redundancy in mind. As such, the through silicon vias (TSV) or through electrodes themselves are also tested to determine exactly which TSVs are defective and fail to meet the performance expectations. The defective through silicon vias (TSV) or through electrodes may then be substituted with the redundant through silicon vias (TSV) or through electrodes. Even when defective through silicon vias (TSV) are found after mounting the dies into a vertical stack, only the defective through silicon vias (TSV) or through electrodes identified through testing are substituted with redundant through silicon vias (TSV) or through electrodes. This eliminates waste and increases yield by preserving the functional integrity of the vertically stacked dies (rather than having to discard the entire stack of dies) even when defective through silicon vias (TSV) are found after mounting.

Unlike the core dies 112, the base die 114 may have no cell array for storing data, and, without a cell array, testing the base die 114 may be a difficult process, since it would be difficult to generate various patterns of data needed for testing, for example, the input/output lines of the base die 114. When a wafer test is performed on the base die 114 before stacking of the chips, testing of signal lines for performing read and write operations, for checking the setup/hold margin of each data bus, for defect screening and other input/output performances, etc. would be difficult due to inability to generate various patterns of testing signals due to lack of a cell array in the base die 114.

However, various ways to test the base die 114 having no cell array individually before stacking is provided according to an embodiment of the present disclosure. The base die 114 is provided with a repair circuit for repairing defective through silicon vias (TSV) or through electrodes, but this through silicon via (TSV) repair circuit may not be needed until the base die 114 is mounted as the base die of the vertical stack. More specifically, a through silicon via (TSV) repair circuit may include a selection circuit (for example, a circuit including a multiplexor MUX), which is used for selecting, for example, a redundant through silicon via (TSV) or through electrode in order to substitute a defective through silicon via (TSV) or through electrode with a non-defective through silicon via (TSV) or through electrode. However, this through silicon via (TSV) repair circuit is not necessarily needed or in use when the base 114 is tested individually. During a base die 114 only test, the through silicon via (TSV) repair circuit having a selection circuit is used for generating the patterns of test data according to an embodiment of the present disclosure, as such a wafer level test of the base die 114 only is possible even though no cell array is equipped in the base die 114.

Now referring to FIG. 2, a portion of the base die (or the first integrated circuit chip) 114 related to data transmission will be described in more detail according an embodiment of the present disclosure.

The first integrated circuit chip 114 includes, inter alia, a decoding circuit 210, a divider circuit 220, a selection signal generation circuit 230, transmission circuits 240 and 241, latch circuits 250 and 251, through silicon vias (TSV) or through electrodes TSVR<0> and TSVR<1>, and data nodes DQ<0> and DQ<1>.

As described above, the first integrated circuit chip 114 may include a plurality of through electrodes such as TSVR<0> and TSVR<1> formed vertically through the inside thereof. When a defect occurs in one of the plurality of through electrodes TSVR<0> and TSVR<1>, the first integrated circuit chip 114 may replace the defective through electrode with an adjacent or another through electrode.

Figure 2:
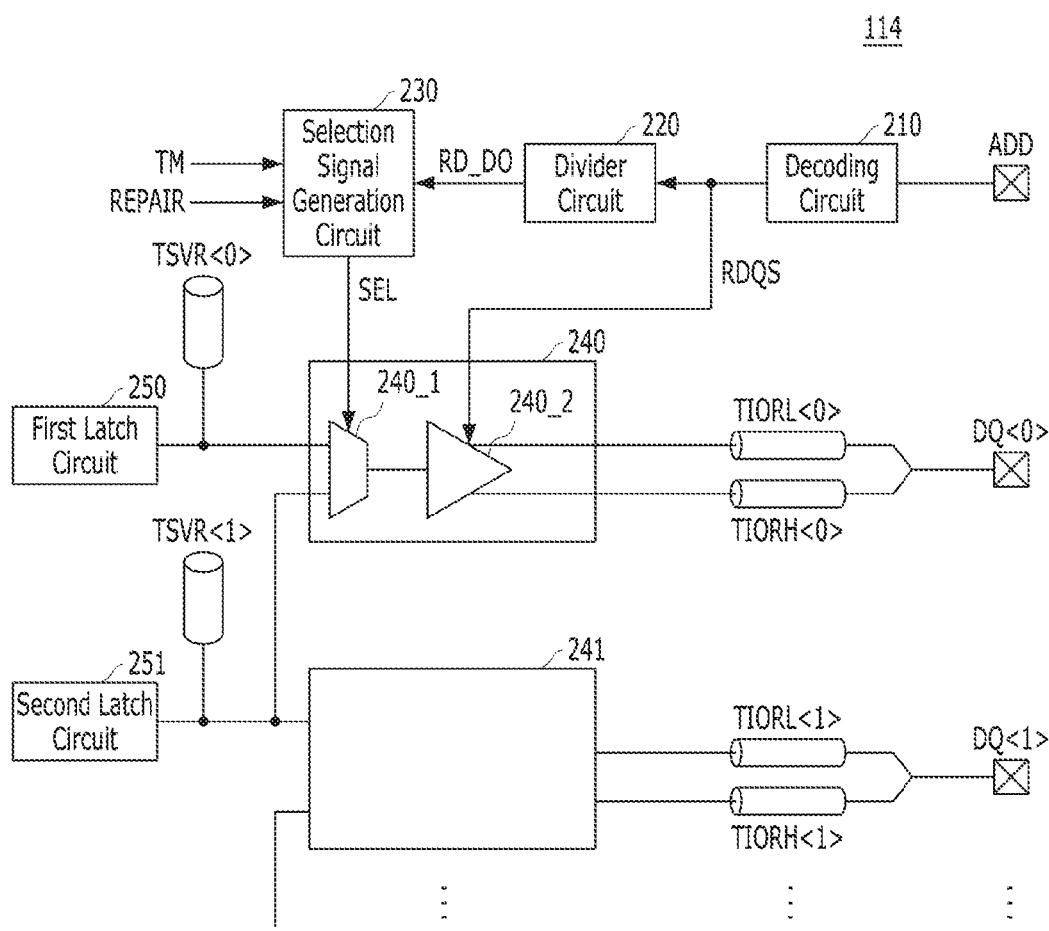
FIG. 2 shows a first integrated circuit chip of FIG. 1 in accordance with an embodiment of the present invention.

FIG. 2 shows the first and second through electrodes TSVR<0> and TSVR<1> among the plurality of through electrodes of the first integrated circuit chip 114. Similarly, in FIG. 2, the first integrated circuit chip 114 includes the first and second transmission circuits 240 and 241, the first and second latch circuits 250 and 251, and the first and second data nodes DQ<0> and DQ<1> that correspond to the first and second through electrodes TSVR<0> and TSVR<1>, respectively. However, it is noted that the scope of the present embodiment is not limited thereto.

The first and second data nodes DQ<0> and DQ<1> respectively corresponding to the first and second through electrodes TSVR<0> and TSVR<1> serve as the nodes for transmitting/receiving data to/from the memory controller 120. The first and second data nodes DQ<0> and DQ<1> may be connected to the interposer 130 through micro bumps or the like and connected to the interface PHY of the memory controller 120 through the interposer 130.

The first and second latch circuits 250 and 251 may store data transmitted/received through the first and second through electrodes TSVR<0> and TSVR<1>. During a write operation, the data, which are inputted through the first and second data nodes DQ<0> and DQ<1> may be stored in the first and second latch circuits 250 and 251 and transmitted to the respective first and second through electrodes TSVR<0> and TSVR<1>. During a read operation, the data, which are read from the second integrated circuit chips 112, may be stored in the first and second latch circuits 250 and 251 for transmission through the first and second through electrodes TSVR<0> and TSVR<1>, respectively. During a test operation in accordance with an embodiment of the present disclosure, data having different logic levels may be inputted through the first and second data nodes DQ<0> and DQ<1> and may be stored in the first and second latch circuits 250 and 251, respectively.

The signals from the first and second through electrodes TSVR<0> and TSVR<1> are transmitted to the first and second data nodes DQ<0> and DQ<1> by the first and second transmission circuits 240 and 241. That is, during a read operation, the data read from the second integrated circuit chips 112 are inputted through the first and second through electrodes TSVR<0> and TSVR<1>, and the first and second transmission circuits 240 and 241 may serve to transmit the input data to the first and second data nodes DQ<0> and DQ<1> through data lines TIORL<0:1> and TIORH<0:1>. The first and second transmission circuits 240 and 241 may serial-to-parallel convert the input data, and transmit the converted data to the data lines TIORL<0:1> and TIORH<0:1>. Shown in FIG. 2 is for an operation of serial-to-parallel converting of data at 1:2 ratio, but the scope of present embodiment is not limited thereto.

The first transmission circuit 240 may select one of the signals transmitted through the first and second through electrodes TSVR<0> and TSVR<1> in response to a selection signal SEL, and transmit the selected signal to the first data node DQ<0>. In accordance with an embodiment, during a test operation, the first transmission circuit 240 may alternately transmit the data stored in the first and second latch circuits 250 and 251 to the first data node DQ<0> in response to the selection signal SEL. That is, since data having different logic levels are stored in the first and second latch circuits 250 and 251 during a test operation, the first transmission circuit 240 may transmit data toggling to different logic levels to the first data node DQ<0>.

The first transmission circuit 240 may include a selector 240_1 and a read driver 240_2. The selector 240_1 may select one of the signals transmitted through the first and second through electrodes TSVR<0> and TSVR<1> in response to the selection signal SEL. The read driver 240_2 may transmit the signal selected by the selector 240_1 to the first data node DQ<0> in response to a read data strobe signal RDQS.

For example, when the selection signal SEL is deactivated to a logic low level, the selector 240_1 may select the signal transmitted through the first through electrode TSVR<0>. On the other hand, when the selection signal SEL is activated to a logic high level, the selector 240_1 may select the signal transmitted through the second through electrode TSVR<1>. Therefore, the read driver 240_2 may transmit the signal transmitted through the first through electrode TSVR<0> to the first data node DQ<0> when the selection signal SEL is deactivated to a logic low level, and transmit the signal transmitted through the second through electrode TSVR<1> to the first data node DQ<0> when the selection signal SEL is activated to a logic high level.

Similar to the operation of the first transmission circuit 241, the second transmission circuit 242 may operate in response to the second through electrode TSVR<1> and a third through electrode (not shown in FIG. 2). Therefore, the duplicated descriptions of the operation of the second transmission circuit 242 will be omitted herein.

The decoding circuit 210 may generate signals for controlling an internal operation by decoding a command/address inputted from the memory controller 120. During a read operation, the decoding circuit 210 may generate a read command signal by decoding a column address ADD. The decoding circuit 210 may generate signals for controlling the read operation, i.e. the read data strobe signal RDQS by synchronizing the read command signal with a clock.

The divider circuit 220 may generate a divided signal RD_OD by dividing the read data strobe signal RDQS generated through the decoding circuit 210. The divider circuit 220 may generate the divided circuit RD_OD by doubling the period of the read data strobe signal RDQS.

In accordance with an embodiment, during a normal operation, the selection signal generation circuit 230 may generate the selection signal SEL based on repair information. On the other hand, during a test operation, the selection signal generation circuit 230 may generate the selection signal SEL using the divided signal RD_OD or a toggling selection signal SEL. The selection signal generation circuit 230 may receive a test mode signal TM, a repair information signal REPAIR and the divided signal RD_OD, and the configuration and operation of the selection signal generation circuit 230 will be described in more detail with reference to FIG. 4 in accordance with an embodiment of the present disclosure.

Figure 3:
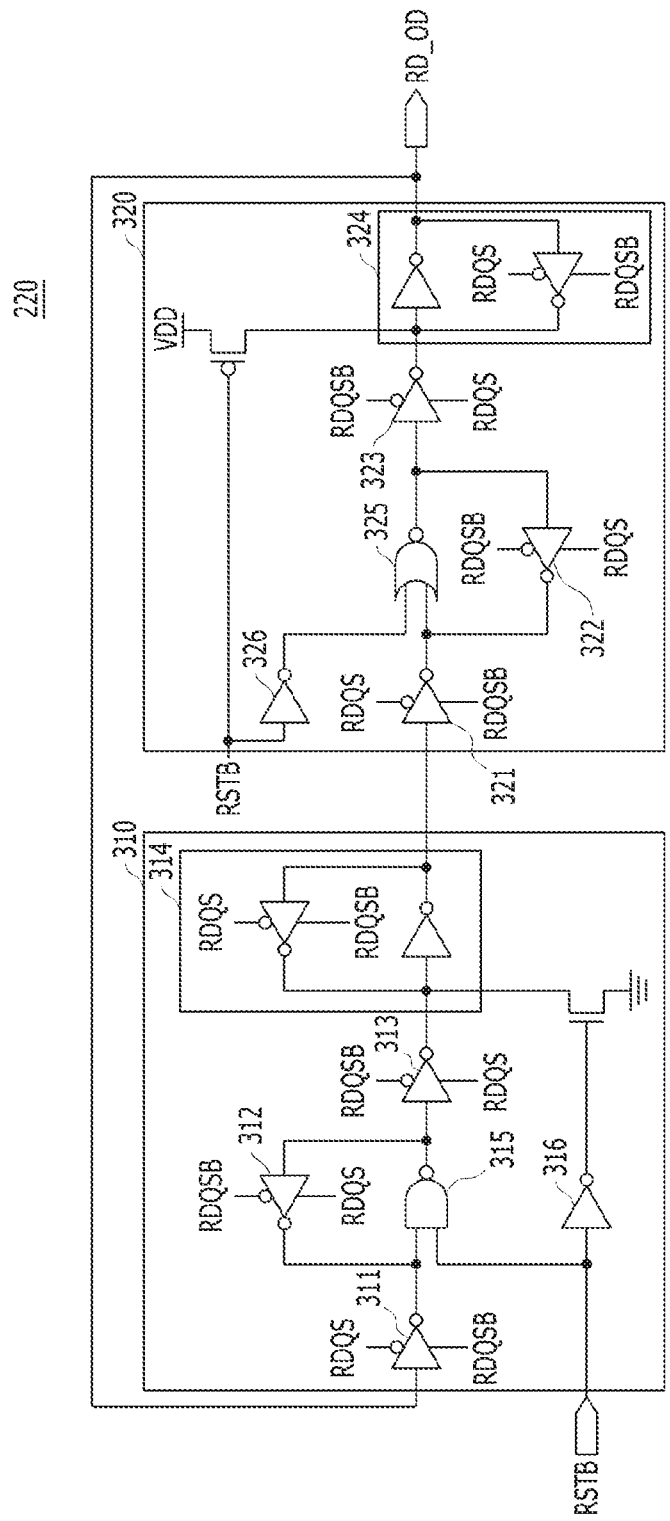
FIG. 3 shows a divider circuit of FIG. 2 in accordance with an embodiment of the present invention.

Referring to FIG. 3, the divider circuit 220 of FIG. 2 may include, inter alia, first and second transfer units 310 and 320 coupled in series.

The first transfer unit 310 may transfer the fed-back divided signal RD_OD to the second transfer unit 320 in response to the read data strobe signal RDQS. While the read data strobe signal RDQS is deactivated at a logic high level, a tri-state inverter 311 and a latch 314 may be turned off, and tri-state inverters 312 and 313 may be turned on. When the read data strobe signal RDQS is activated to a logic low level, the tri-state inverter 311 and the latch 314 may be turned on. When the read data strobe signal RDQS is activated to a logic low level through such an operation, the fed-back divided signal RD_OD may be transferred to the second transfer unit 320. The first transfer unit 310 may further include a NAND gate 315 and an inverter 316 which receive a reset signal RSTB. When the reset signal RSTB is activated to a logic low level, the first transfer unit 310 may be reset.

The second transfer unit 320 may invert an output signal of the first transfer unit 310 and output the inverted signal as the divided signal RD_OD, in response to the read data strobe signal RDQS. While the read data strobe signal RDQS is deactivated at a logic high level, a tri-state inverter 321 and a latch 324 may be turned off, and tri-state inverters 322 and 323 may be turned on. When the read data strobe signal RDQS is activated to a logic low level, the tri-state inverter 321 and the latch 324 may be turned on. When the read data strobe signal RDQS is activated to a logic low level through such an operation, the second transfer unit 320 may invert the output signal of the first transfer unit 310 and output the inverted signal as the divided signal RD_OD. The second transfer unit 320 may further include a NOR gate 325 and an inverter 326 which receive the reset signal RSTB. When the reset signal RSTB is activated to a logic low level, the second transfer unit 320 may be reset.

Figure 4:
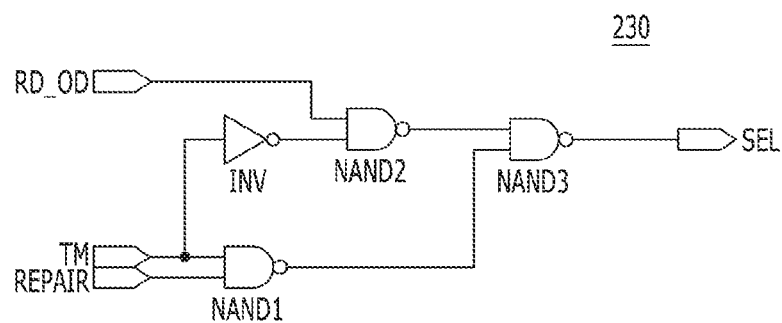
FIG. 4 shows a selection signal generation circuit of FIG. 2 in accordance with an embodiment of the present invention.

FIG. 4 shows the selection signal generation circuit 230 of FIG. 2 according to an embodiment of the present disclosure. The selection signal generation circuit 230 may include, inter alia, an inverter INV and first, second, and third gates NAND1, NAND2, and NAND3, all of which are NAND gates according to an embodiment of the present disclosure; however, it is also possible that the same logical operation can be performed by a combination of other logic gates.

The first gate NAND1 may receive the test mode signal TM and the repair information signal REPAIR. The first gate NAND1 may perform a NAND logic operation on the test mode signal TM and the repair information signal REPAIR, and output the result value of the NAND logic operation.

The second gate NAND2 may receive the divided signal RD_OD and the test mode signal TM inverted by the inverter INV. The second gate NAND2 may perform a NAND logic operation on the divided signal RD_OD and the inverted test mode signal TM, and output the result value of the NAND logic operation.

The third gate NAND3 may receive the output signals of the first and second gates NAND1 and NAND2. The third gate NAND3 may perform a NAND logic operation on the output signals of the first and second gates NAND1 and NAND2, and output the result value of the NAND logic operation as the selection signal SEL.

In accordance with an embodiment, when the first integrated circuit chip 114 performs a normal operation, the test mode signal TM may be deactivated to a logic high level. When the test mode signal TM is at a logic high level, the first gate NAND1 may activate or deactivate the output signal according to the repair information signal REPAIR. On the other hand, the second gate NAND2 may output a high-level output signal regardless of the divided signal RD_OD. Therefore, the third gate NAND3 may activate or deactivate the selection signal SEL according to the output signal of the first gate NAND1.

When the first integrated circuit chip 114 performs a normal operation, the selection signal generation circuit 230 may activate or deactivate the selection signal SEL according to the repair information signal REPAIR. The repair information signal REPAIR may be activated or deactivated depending on whether a defect is detected in the first through electrode TSVR<0>.

For example, when no defect is detected in the first through electrode TSVR<0>, the repair information signal REPAIR may be deactivated to a logic low level. According to the low-level repair information signal REPAIR, the selection signal generation circuit 230 may deactivate the selection signal SEL to a logic low level. When the selection signal SEL is at a logic low level as described above, the first transmission circuit 240 may select the signal transmitted through the first through electrode TSVR<0>, and transmit the selected signal to the first data node DQ<0>.

On the other hand, when a defect is detected in the first through electrode TSVR<0>, the repair information signal REPAIR may be activated to a logic high level. According to the high-level repair information signal REPAIR, the selection signal generation circuit 230 may activate the selection signal SEL to a logic high level. When the selection signal SEL is at a logic high level as described above, the first transmission circuit 240 may select the signal transmitted through the second through electrode TSVR<1>, and transmit the selected signal to the first data node DQ<0>.

In accordance with an embodiment, when the first integrated circuit chip 114 performs a test operation, the test mode signal TM may be activated to a logic low level. When a wafer level test is performed on the first integrated circuit chip 114, the test mode signal TM may be activated to a logic low level. However, the scope of the present embodiment is not limited thereto.

When the test mode signal TM is at a logic low level, the first gate NAND1 may output a high-level output signal regardless of the repair information signal REPAIR. On the other hand, the second gate NAND2 may activate or deactivate an output signal according to the divided signal RD_OD. Therefore, the third gate NAND3 may activate or deactivate the selection signal SEL according to the output signal of the second gate NAND2.

When the first integrated circuit chip 114 performs a test operation, the selection signal generation circuit 230 may activate or deactivate the selection signal SEL according to the divided signal RD_OD. Since the divided signal RD_OD toggles according to the read data strobe signal RDQS, the selection signal generation circuit 230 may generate the selection signal SEL by toggling the selection signal SEL during a read operation. The first transmission circuit 240 may alternately transmit the data stored in the first and second latch circuits 250 and 251 to the first data node DQ<0>.

Figure 5:
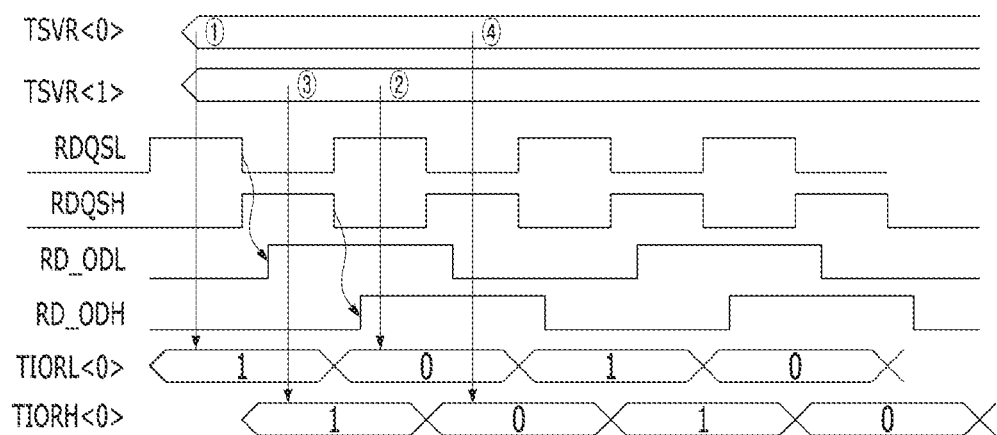
FIG. 5 shows signal waveforms of the first integrated circuit chip of FIG. 2 in accordance with an embodiment of the present invention.

FIG. 5 shows signal waveforms of the first integrated circuit chip 114 of FIG. 2 in accordance with an embodiment of present disclosure.

FIG. 5 illustrates the waveforms of data transmitted from the first and second through electrodes TSVR<0> and TSVR<1> to the first data node DQ<0> by the first transmission circuit 240 and signals for controlling the data. As described above, the data transmitted to the first data node DQ<0> may be transmitted in parallel through the first and second data lines TIORL<0> and TIORH<0>. Thus, shown in FIG. 5 are a plurality of control signals related to the data.

When a write operation is started after the first integrated circuit chip 114 enters the test mode, test data may be inputted through the first and second data nodes DQ<0> and DQ<1>. The test data may be transmitted to the first and second through electrodes TSVR<0> and TSVR<1>, and finally stored in the first and second latch circuits 250 and 251.

In accordance with an embodiment, first and second data having logic levels different from each other (for example, 1:0) may be stored in the first and second latch circuits 250 and 251 corresponding to the first and second through electrodes TSVR<0> and TSVR<1>, respectively. The test data may be toggling data. Although the test data inputted through the first and second data nodes DQ<0> and DQ<1> toggle, the last input data may have different values.

When a read operation is started after the write operation, the decoding circuit 210 may generate first and second read data strobe signals RDQSL and RDQSH by decoding the column address ADD. The divider circuit 220 may generate first and second divided signals RD_ODL and RD_ODH by dividing the first and second read data strobe signals RDQSL and RDQSH.

Whenever the first and second read data strobe signals RDQSL and RDQSH transition to a logic low level, the logic levels of the first and second divided signals RD_ODL and RD_ODH may transition. The first and second divided signals RD_ODL and RD_ODH may have a period increased by double the period of the first and second read data strobe signals RDQSL and RDQSH. Whenever the first and second read data strobe signals RDQSL and RDQSH are activated, the first and second divided signals RD_ODL and RD_ODH may alternately have high and low-level values. The dividing method or operation may be performed in various manners depending on embodiments, and the present embodiment is not limited thereto.

Therefore, when the first data strobe signal RDQSL is activated for the first time (labeled with encircled "1" in FIG. 5), the first divided signal RD_ODL may have a logic low level. The selection signal generation circuit 230 may deactivate the selection signal SEL to a logic low level in response to the low-level divided signal RD_ODL. When the selection signal SEL is at a logic low level, the selector 240_1 may select first data 1 stored in the first through electrode TSVR<0>, i.e. the first latch circuit 250. The read driver 240_2 may transmit the selected first data 1 to the first data line TIORL<0> in response to the first read data strobe signal RDQSL.

Then, when the first data strobe signal RDQSL is activated for the second time (labeled with encircled "2" in FIG. 5), the first divided signal RD_ODL may have a logic high level. The selection signal generation circuit 230 may activate the selection signal SEL to a logic high level in response to the high-level divided signal RD_ODL. When the selection signal SEL is at a logic high level, the selector 240_1 may select second data 0 stored in the second through electrode TSVR<1>, i.e. the second latch circuit 251. The read driver 240_2 may transmit the selected second data 0 to the first data line TIORL<0> in response to the first read data strobe signal RDQSL.

Similarly, when the second read data strobe signal RDQSH is activated for the first time (labeled with encircled "3" in FIG. 5) and the second divided signal RD_ODH has a logic low level, the selection signal generation circuit 230 may deactivate the selection signal SEL to a logic low level. The first transmission circuit 240 may select the first data 1 stored in the first through electrode TSVR<0>, i.e. the first latch circuit 250, and transmit the selected data to the second data line TIORH<0>. When the second read data strobe signal RDQSH is activated for the second time (labeled with encircled "4" in FIG. 5) and the second divided signal RD_ODH has a logic high level, the selection signal generation circuit 230 may activate the selection signal SEL to a logic high level. The first transmission circuit 240 may select the second data 0 stored in the second through electrode TSVR<1>, i.e. the second latch circuit 251, and transmit the selected data to the second data line TIORH<0>.

In accordance with an embodiment of the present disclosure, the integrated circuit chip may toggle data to be transmitted through the data lines TIORL<0> and TIORH<0>, using the read data strobe signals RDQSL and RDQSH for controlling a read operation. That is, the integrated circuit chip may transmit logic high-level and logic low-level data according to the bandwidth of data, and thus check a setup/hold margin of the data lines TIORL<0> and TIORH<0> or detect a defect.

In accordance with an embodiment of the present disclosure, the integrated circuit chip may toggle data transmitted through a data path by switching the data path. In particular, even when a memory cell array is not provided in an integrated circuit chip like in the case of a base die, the integrated circuit chip may transmit toggling data to the data path, and check a setup/hold margin of the data path or detect a defect. Furthermore, since the integrated circuit chip can switch the data path using a repair circuit installed in the base die, the data input/output lines may be tested without an additional circuit configuration or an increase in signal loading.

Although various embodiments have been described for illustrative purposes, it will be apparent to those skilled in the art that various changes and modifications may be made without departing from the spirit and scope of the invention as defined in the following claims.

What is claimed is:

1. An integrated circuit chip comprising:
   a data node configured to conduct integrated circuit chip signals;
   a first through electrode and a second through electrode, both electrodes being formed through the integrated circuit chip;
   a transmission circuit comprising:
   a selection signal input; and
   a selector comprising: a first data input coupled to the first through electrode, a second data input coupled to the second through electrode and a data output;
   the transmission circuit being configured to selectively couple, one of the first and second through electrodes to the data node, in response to a selection signal, provided to the selection signal input;
   the integrated circuit chip additionally comprising:
   a selection signal generation circuit, which is configured to provide the selection signal responsive to an active state of at least one of: a test operation signal, a repair signal and a read data strobe signal; and
   a read driver configured to couple the selector data output to one of two different data lines in response to the read data strobe signal,
   wherein the selection signal generation circuit comprises:
   a first NAND gate suitable for receiving a repair information signal and a test mode signal and performing a NAND operation on the received signals;
   a second NAND gate suitable for receiving the divided signal and an inverted signal of the repair information signal and performing a NAND operation on the received signals; and
   a third NAND gate suitable for receiving output signals of the first and second NAND gates, and generating the selection signal by performing a NAND operation on the received signals.

2. The integrated circuit chip of claim 1, wherein, during a normal operation, the selection signal generation circuit activates or deactivates the selection signal based on repair information.

3. The integrated circuit chip of claim 1, wherein the repair information signal is activated or deactivated according to whether a defect is detected in the first through electrode.

4. The integrated circuit chip of claim 1, wherein the test mode signal is activated when the integrated circuit chip is subjected to a wafer level test.

5. The integrated circuit chip of claim 1, further comprising:
   a first latch unit and a second latch unit coupled to the first and second through electrodes, respectively, and configured to store data having different logic levels during the test operation.

6. The integrated circuit chip of claim 1, wherein the integrated circuit chip comprises a base die of a high bandwidth memory (HBM).

7. An integrated circuit chip comprising:
   a first data node and a second data node;
   a first latch circuit and a second latch circuit configured to store data inputted through the first and second data nodes, respectively; and
   a transmission circuit configured to alternately transmit data stored in the first and second latch circuits to the first data node in response to a selection signal, during a test operation, the transmission circuit comprising:
   a selector having first and second data inputs, a selection signal input, and a data output, the selector configured to operatively connect one of the first and second data inputs to the data output responsive to its receipt of the selection signal; and
   a read driver configured to couple a data signal output from the selector to the first data node in response to a read data strobe signal;
   the integrated circuit chip additionally comprising:
   a selection signal generation circuit, which is configured to provide the selection signal responsive to a test operation signal, a repair signal and a read data strobe signal.

8. The integrated circuit chip of claim 7, wherein during the test operation, data having different logic levels are inputted through the first and second data nodes and stored in the first and second latch circuits.

9. The integrated circuit chip of claim 7, further comprising:
   a selection signal generation circuit configured to generate the selection signal based on repair information during a normal operation, and toggling the selection signal using a read data strobe signal during the test operation.

10. The integrated circuit chip of claim 9, wherein the selection signal generation circuit comprises:
    a first NAND gate suitable for receiving a repair information signal and a test mode signal and performing a NAND operation on the received signals;
    a second NAND gate suitable for receiving a divided signal of the read data strobe signal and an inverted signal of the repair information signal and performing a NAND operation on the received signals; and
    a third NAND gate suitable for receiving output signals of the first and second NAND gates, and generating the selection signal by performing a NAND operation on the received signals.

11. A memory device comprising:
    a first integrated circuit chip; and
    a plurality of second integrated circuit chips stacked over the first integrated circuit chip, wherein the first and second integrated circuit chips transmit/receive data through a plurality of through electrodes formed through the first integrated circuit chip and through the plurality of second integrated circuit chips,
    wherein the first integrated circuit chip comprises:
    a decoding circuit configured to generate a read data strobe signal by synchronizing a read command signal with a clock, during a read operation;
    a divider circuit configured to generate a divided signal by dividing the read data strobe signal;

a transmission circuit comprising a selector having first and second data inputs, a selection signal input and a data output, the selector being configured to couple one of the first and second data inputs to the data output, in response to a selection signal received at the selection signal input; and a read driver configured to couple a data signal output from the selector to one of two data lines, which are coupled to the first data node, in response to the read data strobe signal;

the memory device additionally comprising a selection signal generation circuit configured to provide the selection signal responsive to: a test operation signal, a repair signal and a read data strobe signal.

12. The memory device of claim 11, wherein during a normal operation, the selection signal generation circuit activates or deactivates the selection signal based on repair information.

13. The memory device of claim 12, wherein the repair information indicates whether a defect is present in the first through electrode.

14. The memory device of claim 11, wherein the selection signal generation circuit comprises:

a first NAND gate suitable for receiving a repair information signal and a test mode signal and performing a NAND operation on the received signals;

a second NAND gate suitable for receiving a divided signal of a read data strobe signal and an inverted signal of the repair information signal and performing a NAND operation on the received signals; and a third NAND gate suitable for receiving output signals of the first and second NAND gates, and generating the selection signal by performing a NAND operation on the received signals.

15. The memory device of claim 11, wherein the first integrated circuit chip further comprising a first latch unit and a second latch unit coupled to the first and second through electrodes, respectively, and suitable for storing data having different logic levels during the test operation.

16. The memory device of claim 11, wherein the memory device comprises a high bandwidth memory (HBM).

17. A method of performing a wafer level test on an integrated circuit chip having no cell array by utilizing a repair circuit configured to repair defective through electrodes to generate a test signal during the wafer level test, the method comprising:

generating a toggling signal based on a read data strobe signal;

providing two through electrodes coupled with two latch circuits configured to store test data from the coupled through electrodes;

providing the toggling signal to a through electrode repair circuit as a selection signal, wherein the repair circuit is configured to select one of the two through electrodes in response to the logic level of the toggling signal; and during the wafer level test, generating the test signal by outputting the logic levels of the two latch circuits in response to the toggling signal.

18. The method of claim 17, further comprising:

decoding a read command to generate the read data strobe signal; and dividing the read data strobe signal to generate the toggling signal.

19. The method of claim 17, further comprising:

when a write operation is started after entering the wafer level test, transmitting the test data to the two through electrodes and storing the test data in the two corresponding latch circuits, wherein the test data is toggling data having different logic levels.

20. The method of claim 19, further comprising:

when a read operation is started after the write operation during the wafer level test, generating the toggling signal by generating the read data strobe signal by synchronizing a read command signal with a clock and dividing the read data strobe signal.

* * * * *